United States Patent
Engl et al.

(10) Patent No.: US 7,184,502 B2
(45) Date of Patent: Feb. 27, 2007

(54) CIRCUIT ARRANGEMENT FOR RECOVERING CLOCK AND DATA FROM A RECEIVED SIGNAL

(75) Inventors: Bernard Engl, Miesbach (DE); Peter Gregorius, Munich (DE)

(73) Assignee: Infineon Technologies AG, Munich (DE)

( * ) Notice: Subject to any disclaimer, the term of this patent is extended or adjusted under 35 U.S.C. 154(b) by 873 days.

(21) Appl. No.: 10/301,444

(22) Filed: Nov. 21, 2002

(65) Prior Publication Data
US 2003/0122600 A1    Jul. 3, 2003

(30) Foreign Application Priority Data
Nov. 23, 2001 (DE) ................. 101 57 437

(51) Int. Cl.
H04L 7/00 (2006.01)
H03K 5/01 (2006.01)

(52) U.S. Cl. .................... 375/354; 327/165

(58) Field of Classification Search ........ 375/343, 375/354, 361, 365, 368, 371, 376; 370/479; 327/165; 377/64; 708/422
See application file for complete search history.

(56) References Cited

U.S. PATENT DOCUMENTS

| | | | |
|---|---|---|---|
| 3,793,636 A * | 2/1974 | Clark et al. ............. | 370/479 |
| 5,347,548 A * | 9/1994 | Messerges et al. ........ | 375/371 |
| 5,699,389 A | 12/1997 | Beladi et al. | |
| 5,901,189 A | 5/1999 | Rose | |
| 6,047,033 A * | 4/2000 | Chen ..................... | 375/326 |
| 2005/0058235 A1 * | 3/2005 | Beenson et al. ......... | 375/376 |
| 2005/0110544 A1 * | 5/2005 | Suda et al. ............. | 327/165 |

* cited by examiner

Primary Examiner—Emmanuel Bayard
Assistant Examiner—Lawrence Williams
(74) Attorney, Agent, or Firm—Michael G. Verga, Esq.

(57) ABSTRACT

A circuit arrangement to recover clock and data from a received signal comprises an electronic commutator for sampling the received signal in such a way that several sampling values of a bit cell transmitted with the received signal are distributed time-wise one after the other onto several output connections of the commutator device and emitted there in the form of corresponding intermediate signals. A first circuit combines a first group of intermediate signals of the commutator device into a first uniting signal, which serves as the basis for data recovery or comprises the recovered data signal, while a second circuit combines a second group of intermediate signals of the commutator device into a second uniting signal, which serves as the basis for clock recovery. The second uniting signal is fed to a phase regulator arrangement, which, dependent on this, sets the sampling phases assigned to the individual output connections of the commutator device.

54 Claims, 10 Drawing Sheets

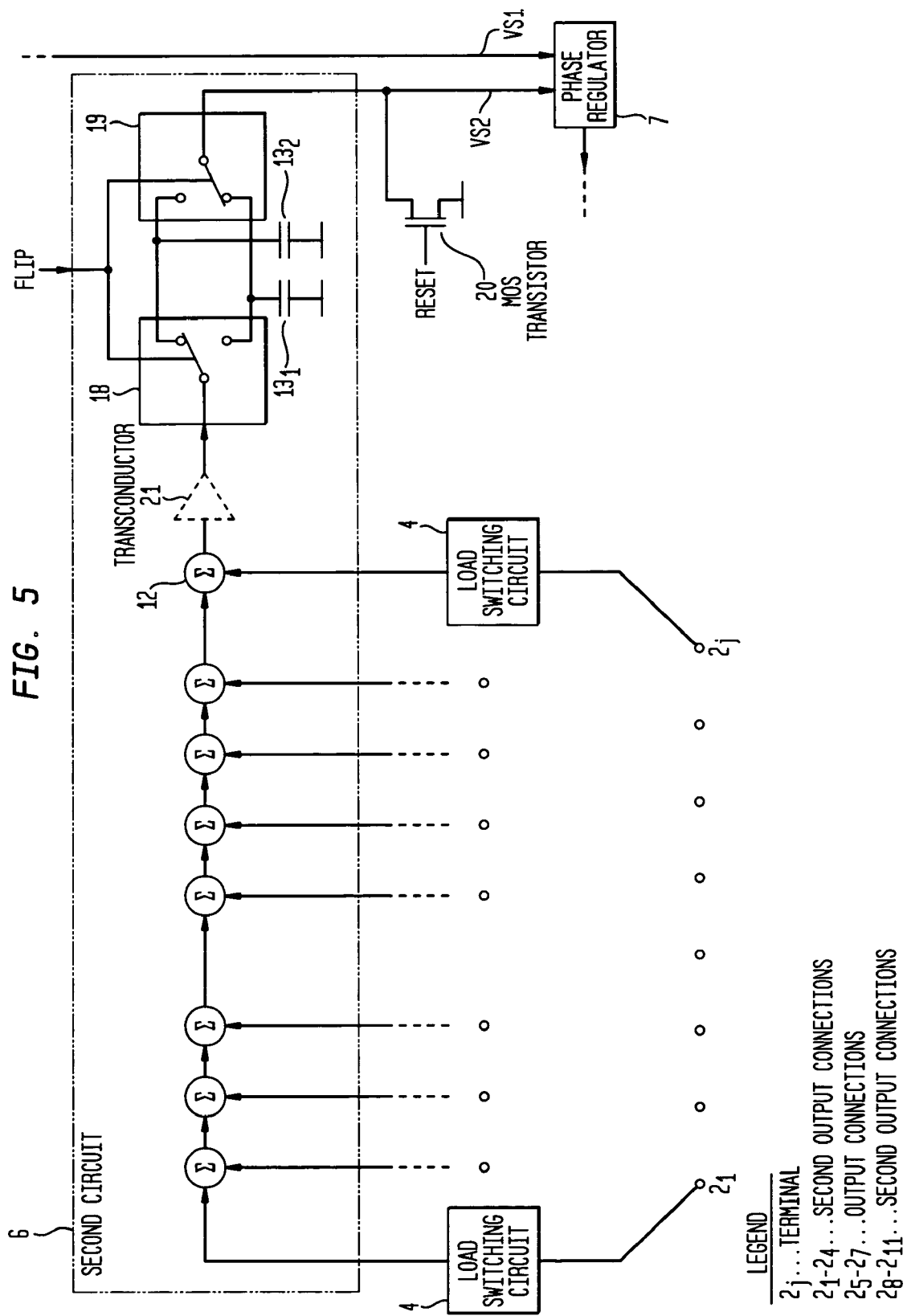

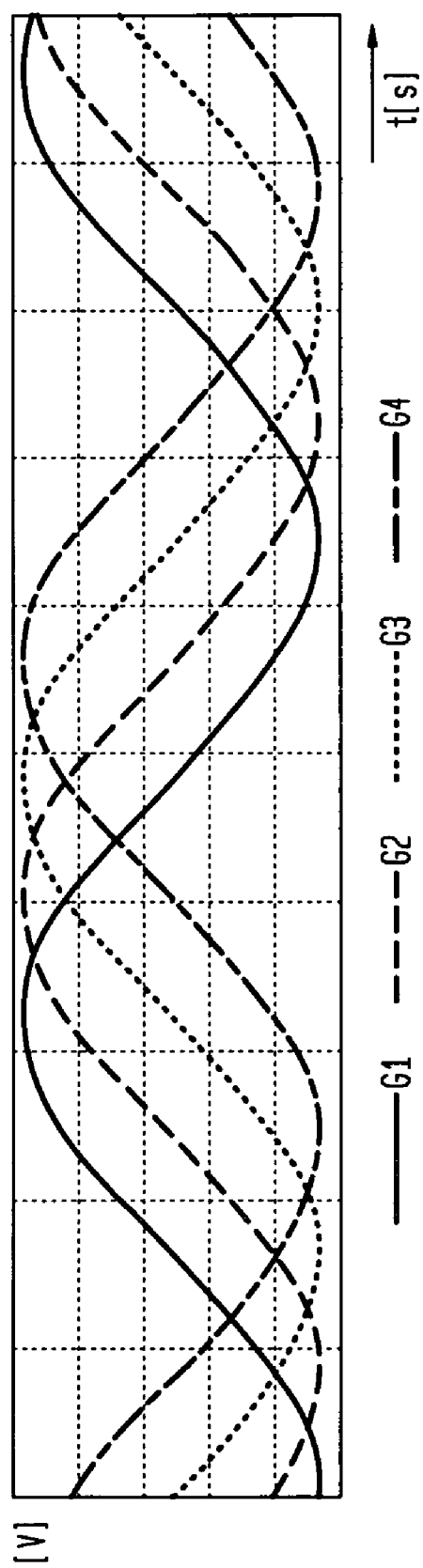

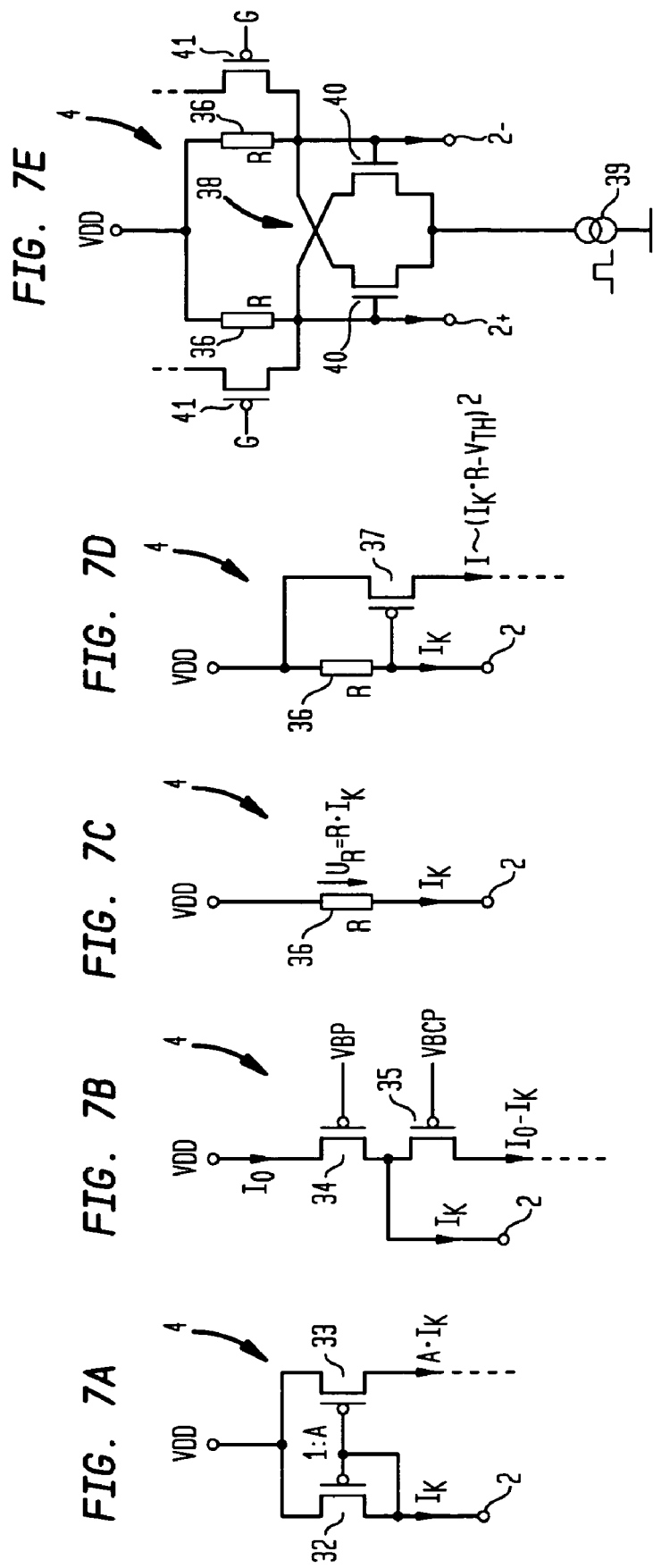

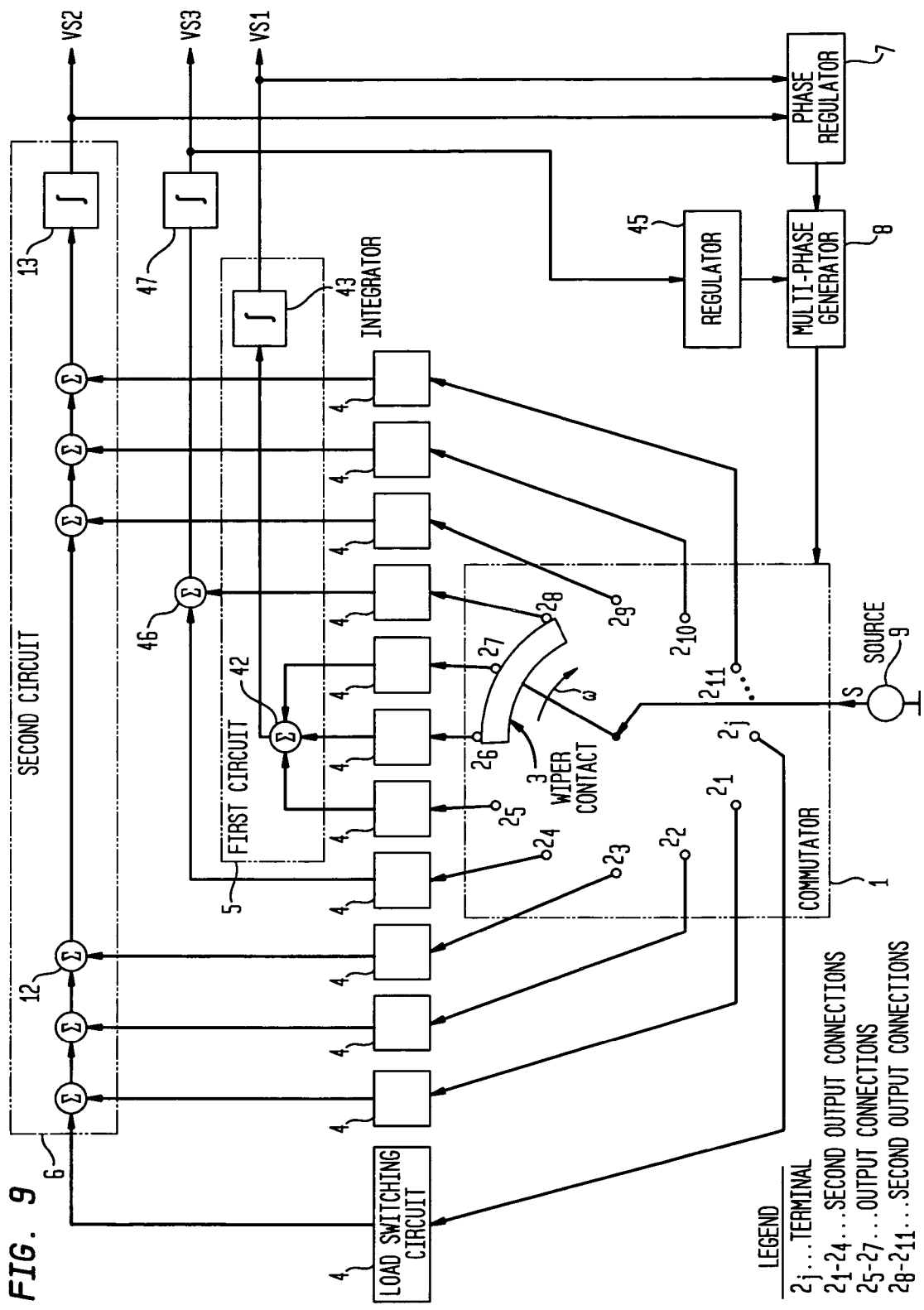

CIRCUIT ARRANGEMENT FOR RECOVERING CLOCK AND DATA FROM A RECEIVED SIGNAL

BACKGROUND OF THE INVENTION

1. Field of the Invention

The present invention relates to a circuit suitable for recovering (regenerating) clock and data from a received signal, in particular to a circuit arrangement for recovering clock and data from a received analog signal.

2. Related Art

In communication systems, there is frequently a requirement to recover the originally-transmitted data information and the corresponding clock information from a serial data stream of a received signal. This process is usually described as "Clock and Data Recovery" (CDR).

Data rates are continuously increasing. For example, communication between chips on a printed circuit board typically reach 3.125 Gb/s per channel, which consists of two differentially-driven and impedance-controlled traces. As a result of clock jitter, bandwidth limitations of the individual channels, intersymbol-interference (ISI) as well as reflections and crosstalk between the channels, the useful data "eye" opening is only 35% of the particular bit cell. In the above example of a 3.125 Gb/s data stream with NRZ (Non Return to Zero) modulated data, only a data "eye" opening with a length of 112 ps is available per bit cell, while the rest of the bit cell is disturbed by clock jitter, intersymbol interference, reflections, etc.

Irrespective of whether clock and data recovery relies on a delay locked loop (DLL) or phase locked loop (PLL), there are two basically different clock and data information from a received signal, namely sampling of the received signal with phase picking, and phase alignment.

In the case of phase alignment, the position of the sampling edge is adjusted to a 90° phase shift in relation to the received or input signal. The data is recovered by means of a pulsed decision element such as a synchronizing flip-flop.

In the case of sampling, the received signal is sampled several times at various timepoints via decision elements arranged in parallel. The output signal of one of the decision elements is subsequently selected as a regenerated data signal corresponding to the phase position of the received signal in relation to the reference signal, which explains the term "phase picking."

A basic disadvantage of both such conventional methods is that, effectively, in each case only a small portion of the signal flows into the decision elements. This portion is determined based on the position of the clock edge of the sampled decision element and its setup and hold time. In order to minimize impairment to the setup and hold times of the sampled decision element, which can lead to its metastability and therefore to a logically undefined condition, the decision element is generally configured so that its setup and hold times are as short as possible. Therefore, the time segment actually evaluated around the clock edge is very small and, as a result, the signal output evaluated is very minute. High frequency interference, especially high frequency hum, on the supply voltage to the clock is and data recovery unit (CDR unit) or on the received signal leads to an increased bit error rate (BER), particularly when there is a small data "eye" opening.

Current integrating receivers are commonly used to reduce sensitivity to interference when small signal outputs are sampled. In such conventional apporaches, the differential data signal is integrated during the time duration of a bit cell. At the end of the bit cell an evaluation is made as to whether the integral is positive or negative to regenerate the data signal. The advantage of this approach is that the received signal is not sampled at a single timepoint, which could be disturbed by high frequency interference in such a way that the synchronizing flip-flop is metastable. Integration in this case acts as a low pass filter which suppresses any high frequency interference.

For communication systems with only a minimum useful data "eye" opening, for example in the region of 35% of the bit cell, a current integrating receiver of this type is, however, not suitable. This is because the distorted and disturbed signal portion (65% of the bit cell in the case of a data "eye" opening of 35%) that is outside the useful data "eye" opening would be overweighted.

Some conventional phase alignment CDR techniques readjust the phase of the sampling timepoint to the optimum point in the data "eye" center. Such CDR methods require phase detection, which evaluates the phase position of the received signal in relation to the momentary sampling time, and which provides the phase detection result as a control difference to a phase regulator. To execute such phase detection, the phase detector must evaluate the distorted and disturbed time-relevant segment of the received signal outside the useful data "eye" opening.

In the case of purely digital phase detectors, such as for example described in U.S. Pat. No. 4,218,771 and also called "Hogge type," this disturbed time-relevant segment of the received signal is equally sampled by synchronizing flip-flops. As a result, the metastability rate of these flip-flops is correspondingly high. This metastability can then lead further to incorrect phase detection until it is hopefully cancelled by the next pulsing of the synchronizing flip-flops. Deficient phase detection of this kind leads to additional jitter of the sampling timepoint and, as a result, further constricts the useful data "eye" opening. The metastability problem also impairs more recent purely digital phase detectors, since basically metastability cannot be eliminated through synchronizers.

Conventional mixed analog/digital phase detectors obtain one of two input signals from a data synchronizing flip-flop. Due to the pulsing of the data synchronizing flip-flops, metastability occurs less often in the data "eye" center. However, such data synchronizing flip-flops can become metastable through high frequency interference at the moment of sampling. As a result, phase detection is equally disturbed in mixed analog/digital phase detectors as in the case of the purely digital phase detector.

To prevent individual metastability events from impairing clock and data recover, the single synchronizing flip-flop of such conventional phase detection systems have been replaced with a majority decision of several synchronizing flip-flops. Unfortunately, the time shift of the individual synchronization pulses inside the majority decision element principally has no clearly defined phase position, leading to phase uncertainty in the case of clock and data recovery. Therefore, a phase detector of the type described above, in which an input phase originates from the synchronized (that is to say regenerated) data signal is basically unsuitable for a majority decision by several synchronizing flip-flops.

For this reason, purely digital CDR methods working with sampling are normally used for implementing such a majority decision. In such devices, the data signal is fed to a number of digital synchronizing flip-flops. The flip-flops are pulsed with a multi-phase pulse so that each bit cell is acquired at several places. The synchronizing flip-flops subsequently search through the resulting digital data stream for signal changes by means of complex digital circuitry. To recover the phase information, the bits corresponding to the data "eye" center are selected based on the phase information ("phase picking"). The selected bits are subsequently combined into a parallel data stream.

In the case of a purely digital CDR method of this kind working with sampling, a massively-multiplied digital data stream therefore occurs. Ultimately, once the phase position has been recognized the greatest part of the digital data stream is rejected. Significant expenditures of energy for such kinds of digital CDR methods working with sampling for cost-favorable Gb/s communication systems, in which a number of channels ought to be integrated on one chip, and which nevertheless must function with only a minimum useful data "eye" width of typically 35%, is much too great.

This will be quantitatively described below by way of a simple example. For the simplest majority decision, such as "2 out of 3," the sampling intervals of three synchronizer flip-flops active one after the other must divide the minimum data "eye" width by three. It is assumed that one of these could become active due to a phase error in sampling at the data "eye" edge and therefore metastable. If the minimum data "eye" width is 35% of the bit cell, the sampling interval must be 35%÷3=11.6% of the bit cell. Therefore, the bit cell must be divided by sampling into at least 8.57 parts. As a result, nine synchronizing flip-flops per bit cell are necessary. This increases the rate of the data stream by a factor 9, that is, a data stream with a bit rate of, for example, 3.125 Gb/s becomes a data stream of 28.125 Gb/s. This increased data rate has to be processed purely digitally. For adequate robustness of phase detection, a sufficiently large number of signal changes must be included in the evaluation. Thus, for example, to this end eight consecutive bit cells, that is to say, one byte, can be used. Therefore, an amount of 8×9=72 sampling points flow into the phase detection, and the space and energy requirement increases accordingly. Regarding its power capacity, although the purely digital CDF method working with sampling and phase selection is the best possible, since it is generally resistant to clock jitter, interference and metastability, this CDR method has the disadvantage of considerable space and energy requirement.

In summary, it can be stated that although with the purely digital CDR method working with sampling described and its variants a solution for the metastability problems is known from prior art, this purely digital solution brings with it disadvantageous space and energy requirements. The known mixed analog/digital methods on the other hand provide no solution to the metastability problems.

In the present invention, the inventor seeks to provide a clock and data recovery circuitry, whereby the advantageous sampling of the input or received signal will be maintained for recovering the data stream, without as a result increasing the data rate to be processed digitally so massively as is the case with the CDR circuit arrangements working with sampling known until now. Data regeneration as well as phase detection in this case ought to be as resistant as possible to metastabilities of synchronizing flip-flops, whereby especially the invention should be easy to implement from a circuitry aspect (for example using CMOS technology) and complex circuits, as for example adjustment of the pulse duty factor of the regenerated data signal to 50% known from the state of the art or equalization of delay times of the signal paths for data regeneration and phase detection etc. are eliminated.

In accordance with one aspect of the invention, a circuit arrangement to recover clock and data from a received signal is disclosed, comprising a commutator device for sampling the received signal in such a way that several sampling values of a bit cell, transmitted with the received signal, are distributed time-wise consecutively onto several output connections of the commutator device, and are emitted there in the form of corresponding intermediate signals, a first circuit for combining a first group of intermediate signals of the commutator device into a first uniting signal, which serves as the basis for data recovery, a second circuit for combining a second group of intermediate signals of the commutator device into a second uniting signal, which serves as the basis for clock recovery, and a phase regulator arrangement, to which is fed the second uniting signal and which, dependent on this, sets sampling phases for sampling the received signal assigned to the individual output connections of the commutator device.

BRIEF DESCRIPTION OF THE DRAWINGS

The invention is described in more detail below on the basis of preferred embodiments with reference to the accompanying drawing, in which:

FIG. 5 shows an exemplary implementation of the two CDR circuits shown in FIG. 1 and FIG. 2.

FIGS. 6A and 6B shows one implementation from the circuit aspect of an electronic commutator shown in FIGS. 1 and 2.

FIGS. 7A–7E show various implementations from the circuit aspect of the load switching circuits shown in FIGS. 1 and 2.

FIG. 9 shows the structure of CDR circuitry in accordance with a fourth embodiment of the invention.

DETAILED DESCRIPTION

Figure 1:
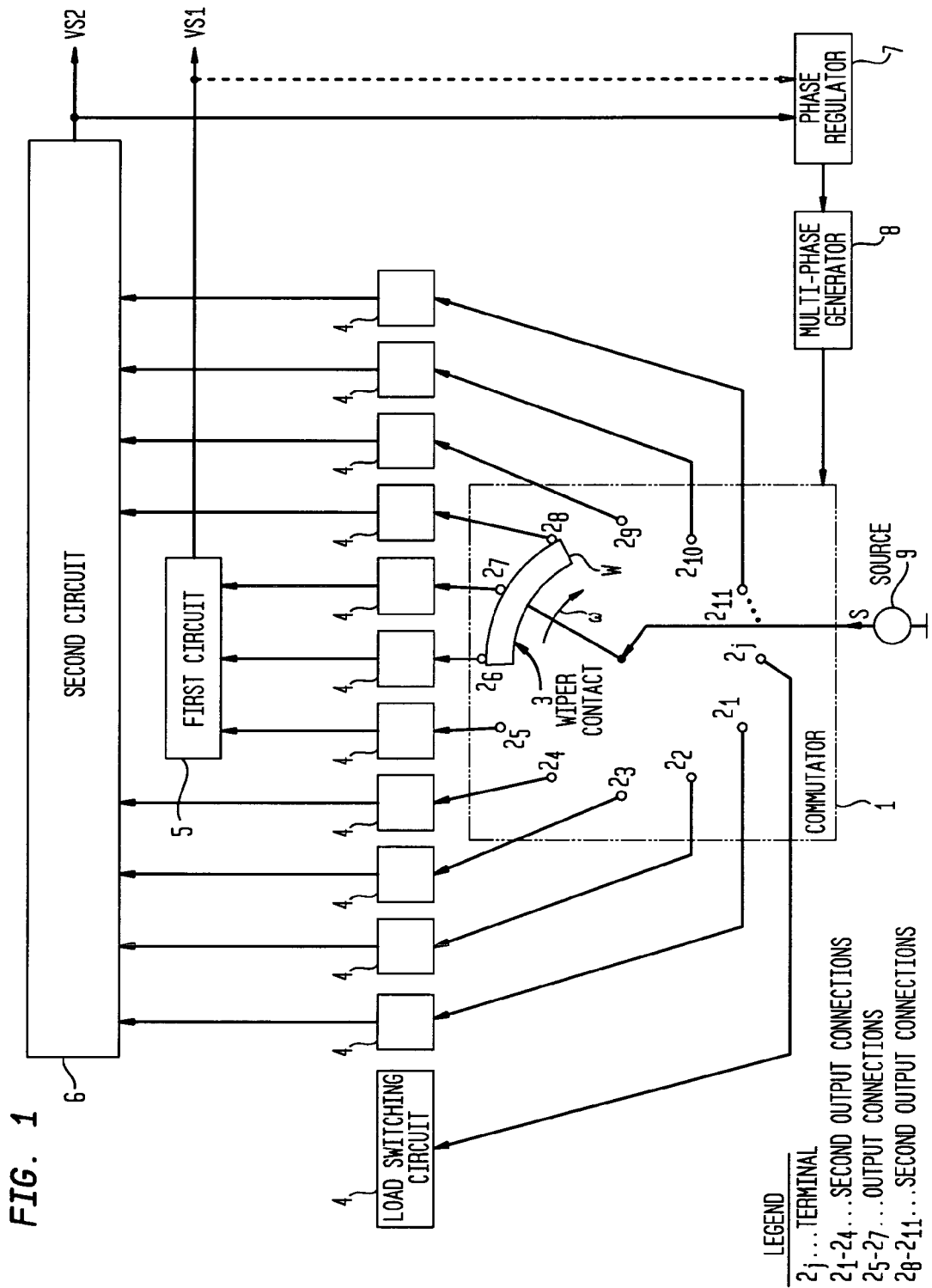
FIG. 1. shows the structure of a circuit arrangement for clock and data recovery (CDR circuitry) according to a first illustrative embodiment of the invention.

The present invention is directed to clock and data recovery circuitry in which sampling of the received signal is carried out with the aid of a commutator device. The received signal is distributed by commutation one after the other onto various output connections of the commutator device, which are preferably connected with load switching circuits. The outputs of selected load switching circuits are combined into at least two uniting signals, whereby all of the signals which are applied to the load switching circuits do not necessarily have to be processed further.

Considerable multiplication of the data rate by this sampling is avoided, because the sampled signal is ultimately concentrated on the uniting signals, which contain time-relevant portions of the received signal, whereby a first portion is used for data recovery and a second portion for clock recovery.

Preferably, the load switching circuits are configured in such a way that the load impedance effected by them is generally the same at all output connections of the commutator device. This reduces kick back of the commutation to the source of the received signal.

The received signal, in particular, is differential and therefore consists of two part signals so that the circuitry according to the invention preferably at least partly has a differential structure. This, in particular, concerns the configuration of the commutator device and the load switching circuits, as described below. The commutator device can, for example, be implemented in the form of a MOS transistor circuit.

The uniting signals can be formed before or after quantization. Integrators are especially suitable as a circuit for forming the particular uniting signals before quantization. In this case, for example, the data signal is obtained after quantization of the first uniting signal. An arrangement of pulsed regenerative amplifier stages, which in each case provide a digital signal, in conjunction with a majority decision element for forming the desired uniting signal from the digital signals is especially suitable as a circuit for forming the particular unifying signal after quantization. In this case, for example, the first uniting signal emitted by a majority decision element of this kind directly corresponds to the regenerated data signal.

A difference between the present invention and the previously known CDR methods is that the (analog) received signal is sampled by the commutator device still in the analog region and, in one embodiment, is time-wise divided into at least two portions. Preferably, the two portions have no intersection or at most, a slight overlap. The first portion forms the basis of a uniting signal for data recovery and the second portion (for example, through integration) the basis of a uniting signal for phase detection. It should be appreciated that further signals to readjust the time division of the received signal can be derived in a simple way.

The advantages which can be achieved with certain embodiments of the present invention include the following. As a result of the homogeneous configuration of the load impedances of the load switching circuits described and through the load overlapping connecting method of the commutator device, harmful kick back of the commutation to the received signal source can be prevented.

Preferably, high frequency analog sampling (in particular in the GHz region) takes place without the clock frequencies having to be greater than the data rate.

Further time-relevant part intervals of the received signal can be weighted as required through appropriate configuration of the load switching circuits. This can be implemented by constant factors or more complex weighting functions, whereby, in this connection, especially squaring of the signal is interesting, since it leads to evaluation of the signal output instead of the signal amplitude.

In addition, by re-uniting the signals into the uniting or combining signals described before further processing, inflation of the data volume is prevented. Digital re-processing can continue on a generally pre-selected and stabilised analog signal, the change timepoints of which are preset by the commutator device and therefore known, so that the probability of metastability of the digital flip-flops is minimised.

The signal re-unification through integration described can directly provide the control difference for phase regulation. Phase detection is preferably a purely analog process and requires no synchronizing flip-flops, the setup or hold time of which could be violated.

The circuitry according to the invention optionally allows the recovery of data by integration, whereby, in contrast to the known state of the art, however, after advantageous time division and optimisation this can be achieved through time-related and amplitude-dependent weighting.

With electronic configuration of the commutator device through appropriate circuit arrangements, the time division of the individual sampling intervals can be rendered controllable. Thus, for example, if a greater data "eye" width is the case as the result of time extension of the output connections responsible for data recovery of the commutator device, a greater portion of the signal can be routed for data recovery than for phase recovery, so that optimisation of the bit error rate is possible.

Complex adjustments of the pulse duty factor or complicated circuit arrangements to equalize the delay of the synchronizing flip-flops, as are generally necessary in CDR circuits according to the presently known state of the art, can be completely eliminated.

Since normally only one bit cell of the received signal must be processed, a considerable reduction in space and energy consumption is possible. Overall, the circuitry according to the invention can be produced without great expense using simple and robust circuit technology.

In the case of the embodiment shown in FIG. 1, analog sampling of an analog received signal S is effected, for which clock and data recovery is carried out by a unit 1 having the function of an electronic commutator. The received signal S is distributed by electronic commutation one after the other onto j different output terminals or output connections $2_1 \ldots 2_j$ (collectively and generally referred to as output connections 2) of the commutator 1. Output connections 2 are individually connected to load switching circuits 4. The outputs of selected load switching circuits 4 are converted via a first circuit 5 or second circuit 6 into at least two uniting signals VS1, VS2. It is not essential that all the signals applied to the load switching circuits 4 be processed further. Thus, for example, the signal of the load switching circuit 4 connected with the terminal $2_j$ of the commutator 1 is not processed further.

The circuit frequency w, with which the commutator 1 rotates, is selected so that analog sampling of the received signal S results. Massive multiplication of the data rate through this sampling is prevented because after the load switching circuits 4, the sampled signal is again concentrated on the at least two uniting signals VS1, VS2 which contain time-relevant portions of the received signal. The first portion corresponding to a first group of output connections $2_5 \ldots 2_7$ of the commutator 1 is used for data recovery and the second portion corresponding to a second group of output connections $2_1 \ldots 2_4$ or $2_8 \ldots 2_{11}$ of the commutator 1 is used for clock recovery.

Preferably, the load circuits 4 are configured in such a way that the load impedance effected by them is generally the same at all commutator output connections 2. This reduces kick back of the commutation to the source 9 of the received signal S, especially if the commutator 1 has a particularly advantageous overlapping connecting method.

Alternatively, a mechanical embodiment of commutator 1 is implemented as a mechanical analog to the electronic commutator 1 shown in FIG. 1. For example, in one embodiment, the commutator of an electric motor is implemented. Such a commutator transmits the pulsation fed to its carbon brushes to the individual coils of the armature one after the other. This mechanical embodiment is especially appropriate if it is considered that the received signal S is actually differential, as described above. That is, the received signal S consists of two part signals. In FIG. 1, only one part signal of these differential part signals is shown for the sake of clarity.

To achieve the especially advantageous overlapping connecting method described below, the rotor of such a commutator has a wiper contact 3 made from a resistance mass W, which weights the received signal S and simultaneously connects to several output connections one after the other. As a result of this preferred configuration of the commutator, the source 9 of the input signal S essentially does not notice the rotation of the commutator. In the case of the electronic commutator, the analog effect can be achieved by triggering MOS transistors with time-wise overlapping gate voltages.

Preperrably, the output connections of the commutator 1 which are combined into the uniting signal VS1 lie time-wise in the center of the data "eye" of the bit cell (in FIG. 1 output connections $2_5 \ldots 2_7$), the uniting signal VS1 is especially suitable for recovering data. Advantageously, three output connections which lie time-wise in the center of the data "eye" should flow into the uniting signal VS1. Accordingly, the uniting signal VS2 is suitable for recovering the phase. This acts, in the case of the circuitry shown in FIG. 1, on a phase regulator 7, which, via a multi-phase generator 8, controls the commutator 1 so that the center of the data "eye" or the particular bit cell lies time-wise in that uniting signal VS1 which serves to recover data. To facilitate recognition of signal changes, the uniting signal VS1 or a digital derivative of this, for example, delayed by a bit pulse, can be fed to the phase regulator 7. This is indicated in FIG. 1 by a dotted signal path.

The uniting signals VS1, VS2 in this case can be formed before or after quantilization. As a circuit for forming the particular uniting signals before quantization, integrators are especially suitable. As a circuit for forming the particular uniting signal after quantization an arrangement of pulsed regenerative amplifier stages, which in each case provide a digital signal, and a majority decision element or a majority decision gate for forming the particular uniting signal from these digital signals is especially suitable.

Having described the principle on which the invention is based, a preferred variant of the clock and data recovery circuitry is now described with reference to FIG. 2.

As noted, the first portion acquired via the output connections $2_5 \ldots 2_7$ of the received signal S divided time-wise by the commutator 1 is used for data regeneration or data recovery. This portion of received signal S is provided to the circuit 5 via the load switching circuits 4. Circuit 5 contains regenerators or regenerative amplifier stages 10 and a majority decision element 11. The uniting signal VS1 is emitted by a majority decision element 11.

The regenerators 10 are, for example, pulsed regenerated amplifiers which, from an analog difference signal on the load switching circuits 4, produce a digital data signal with full signal deviation. The analog difference signal of the load switching circuits 4 can have an extremely minute signal amplitude. The clock of the regenerators 10 can be obtained from the multi-phase time generator 8 in such a way that the regenerative amplification starts after the wiper contact 3 of the commutator 1 has passed the terminals or output connections concerned (that is, $2_5 \ldots 2_7$) so that a signal change is avoided during regeneration. In this way, the risk of metastability is generally eliminated. The majority decision element 11 is, for example, a logic circuit to produce a combinatory link which provides a logic 0 at the VS1 output if more logic 0s than 1s are present at its inputs and produces a logic 1 if more logic 1s than 0s are present at its inputs.

As noted, the second portion of the received signal S divided time-wise by the commutator 1 (output connections $2_1 \ldots 2_4, 2_8 \ldots 2_{11}$) is used for phase evaluation. This second portion, after summation or also weighting by adders 12 reaches at least one integrator 13, which, in the preferred case, can be implemented by currents as input signal as simple capacitor. For phase regulation, it is assumed that in the event of a signal change the integral formed in this way will be 0. The signal change is then optimally equally divided between those time segments, in which the regenerated signal is formed from the uniting signal VS1.

Optionally, a third portion of the received signal divided time-wise by the commutator 1 can be ignored, that is to say, it does not flow into the two uniting signals VS1, VS2, but only leads to the associated load switching circuit 4. This third portion, in the case of the embodiment shown in FIG. 2, only comprises the intermediate signal picked up by the output connection $2_j$. It is particularly expedient to ignore a third portion of the received signal if it is characteristic of the communication system to produce strong interference signals within certain time intervals of the signal change which have to be suppressed.

Depending on the method of signal change which can be easily established by comparing the previous value of the uniting signal VS1 with the actual value of the uniting signal VS1, the result of integration of the uniting signal VS2 must be weighted or changed in its algebraic sign. Therefore, in the case of the embodiment shown in FIG. 2, both uniting signals VS1, VS2 are fed to the phase regulator 7.

Figure 2:
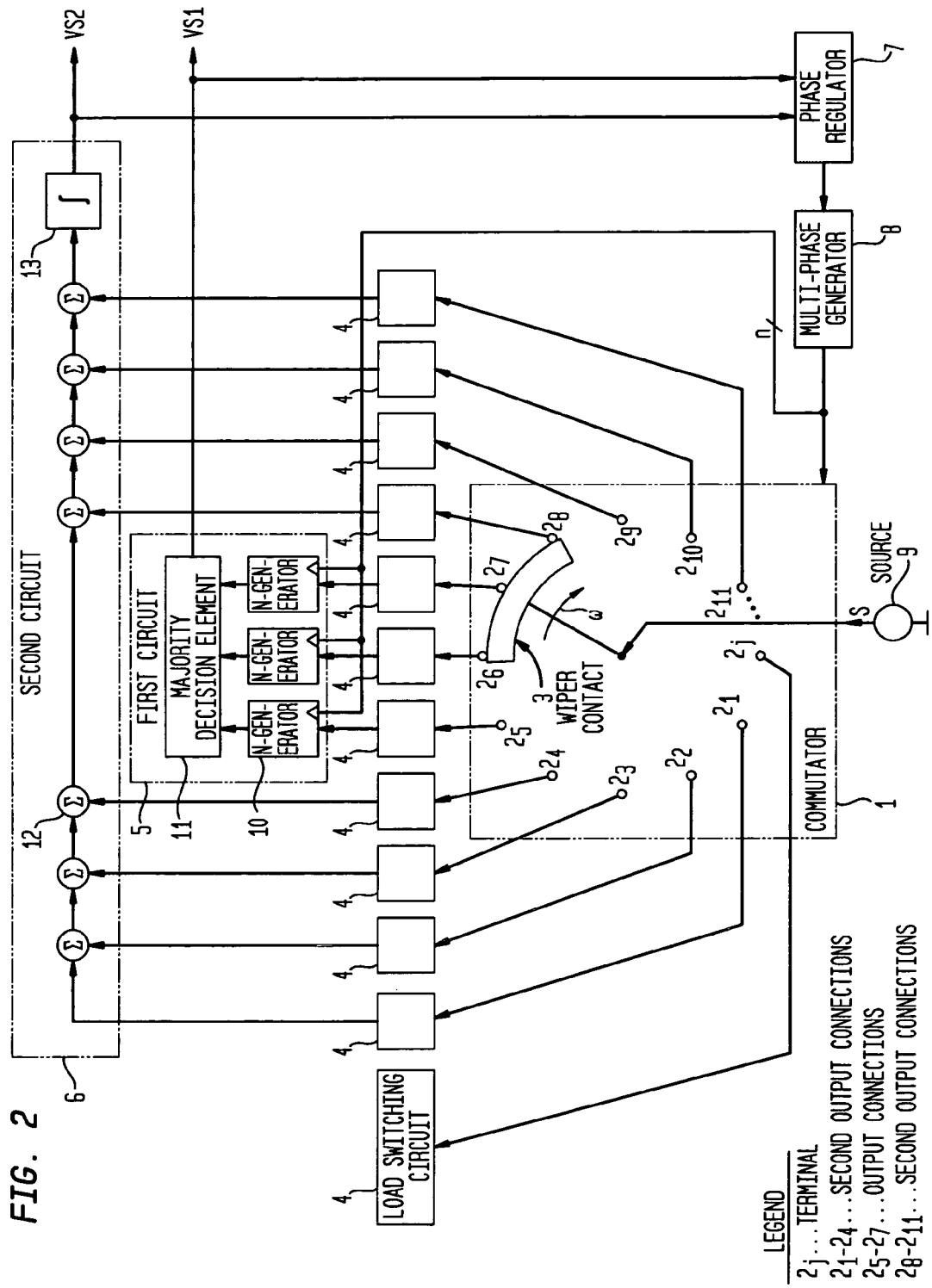
FIG. 2 shows the structure of a CDR circuit arrangement according to a second illustrative embodiment of the invention.
Figure 3:
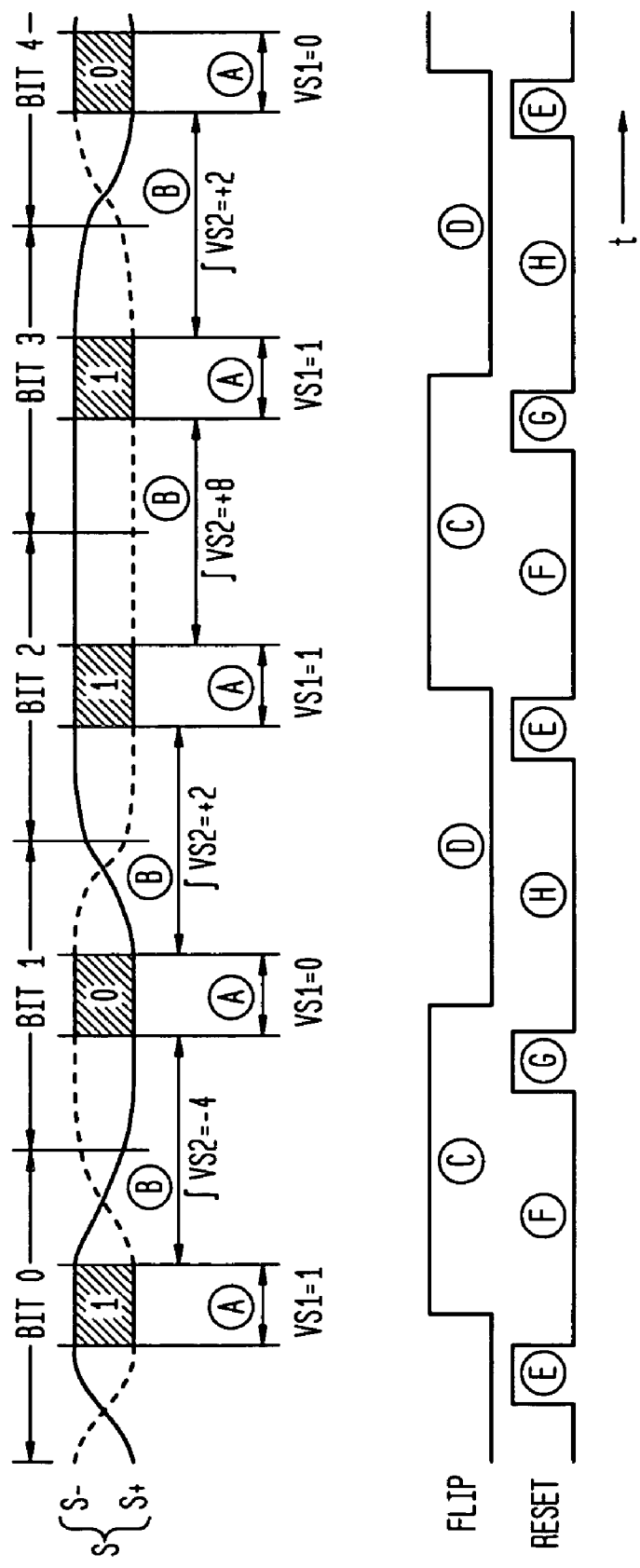
FIG. 3 shows a time-related diagram to elucidate the principal working method of clock recovery or phase control in the case of the CDR circuitry shown in FIG. 2.

FIG. 3 shows the time-related diagram of the principal working method of clock recovery or the working method of phase control of a circuit arrangement according to FIG. 2. In this embodiment, the differential received signal S is represented in the form of the corresponding part signals, which are identified by "S+" and "S−". The shaded areas represent the time intervals A entering the data recovery of the particular data "eye" of the particular bit cell, whereby the signal value of VS1 is always quoted inside the shaded area. The time intervals B lying between the shaded time intervals A contain the signal changes and are integrated with the uniting signal VS2. In each case, an illustrative integral value of VS2 is also quoted for each of these time intervals B.

In the case of a falling edge (signal change "1" to "0"), for example, in the case of change from bit 0 to bit 1 and a negative value for the integral of VS2, the next data recovery must occur earlier (that is to say, the frequency ω must be increased). If the value of the integral on the other hand is positive, the next data recovery must be delayed (that is to say the frequency ω must be reduced). In the case of the example shown, the value for the integral of VS2 during this bit change is −4, that is to say, the frequency must be increased.

In the case of a rising edge (signal change "0" to "1"), for example, in the case of change from bit 1 to bit 2 and a negative value for the integral of VS2, the next data recovery is delayed. If the value of the integral on the other hand is positive, the next data recovery is executed earlier. In the case of the example shown, the value for the integral of VS2 during the change from bit 1 to bit 2 is +2. Thus, the frequency must be increased.

If the received signal is not changed (see the transition from bit 2 to bit 3), no alteration in the frequency or phase position of the commutator 1 takes place.

To readjust the phase it is, therefore, sufficient to compare the uniting signal VS1 of the actual bit cell with the uniting signal VS1 of the previous bit cell and then to weight the integration result of VS2 which represents the phase deviation from the ideal case. With the factors −1, 0 or 1 in order to form a control difference which can be further processed in the phase regulator 7, o control the multi-phase generator 8 and therefore the phase position of the commutator 1.

The phase position of the commutator 1 can optionally be adjusted by changing the delay of a DLL locked loop or by changing the frequency of a PLL locked loop. Therefore, in the above rules of thumb, both cases have been taken into consideration. In contrast to a PLL locked loop, in which a voltage controlled oscillator (VCO) integrates the phase itself, a DLL locked loop requires an integral portion in the phase regulator, in order to be able to adjust the phase position of the commutator 1 based on the integration result of VS2. This established fact does not differ in the case of the present invention from the natural laws previously known from prior art in the case of other CDR circuits, so that further practical implementation of a phase regulator 7 appropriate for the invention can be presumed already known.

Alternatively, the algebraic sign of integration of the uniting signal VS2 can already be commutated during integration, depending on the previous value of the uniting signal VS1, which, at the same time, corresponds to the regenerated data signal, by transposing at one point of the implemented circuit the positive and the negative part signal of a differential signal before the integrator 13. For this purpose, an arrangement for example (not shown in FIG. 2) of selectable switches before the input of the integrator 13 is sufficient, in order to be able to reverse the signal polarity.

Which of these two alternatives is more favorable depends on the detail of the circuitry selected for implementation. Often, it is considered more favorable if the commutation according to the first mentioned variant is only carried out inside the phase regulator 7 after integration has completed, since this takes place with lower signal frequencies and, in addition, requires fewer switches in fast signal paths.

Irrespective of the variants selected for implementation, integration of the integrator 13 as the uniting signal VS2 provides the control difference for the clock phase. The control difference is 0, if the clock phase is ideal, that is to say the data recovery interval lies optimally inside the data "eye". In this case, no readjustment of the phase position of the commutator 1 is necessary. If the control difference is not equal to 0, the phase position of the commutator 1 is reset by the phase regulator 7 corresponding to the controls described above.

In principle, any type of phase regulation, which is known from the state of the art and which, due to the control difference fed to it from integration, ensures the data regeneration interval is tracked according to the above description, is suitable for the CDR circuitry according to the invention.

The present invention can, in particular, be used in so-called plesiochronous communication systems, in which the transmitter and receiver nominally have the same clock frequencies and only the time lags over the individual channels are different.

Figure 4:
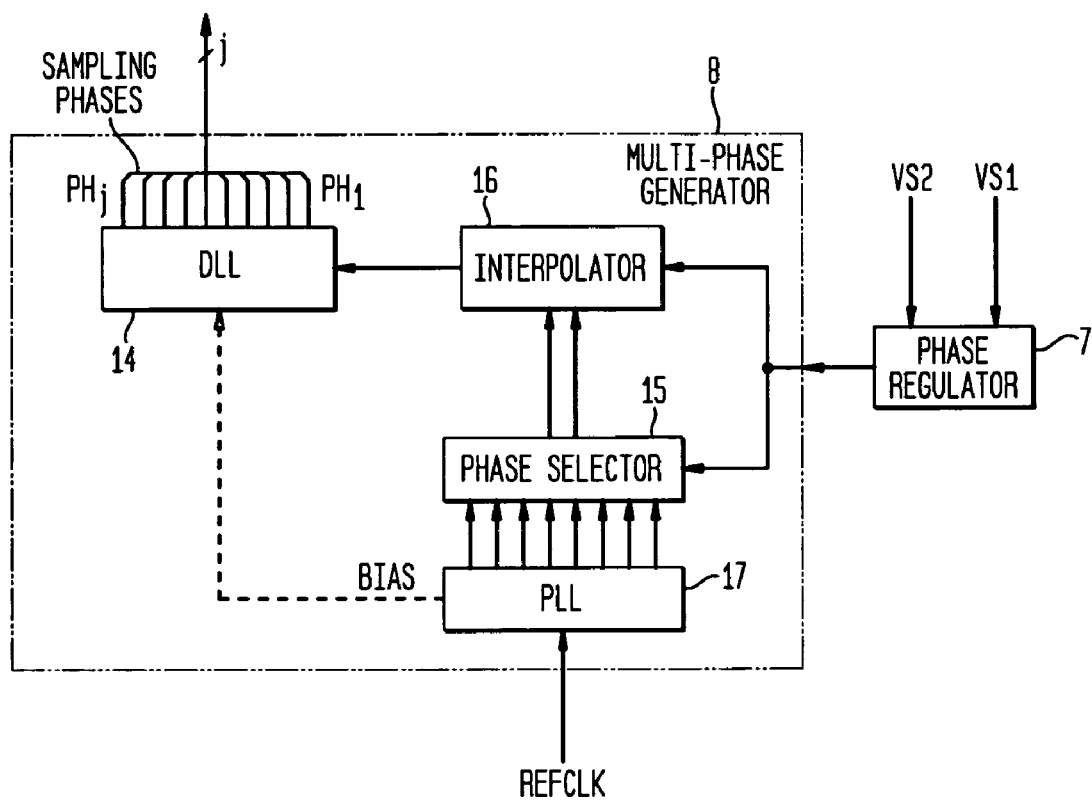
FIG. 4 shows an exemplary structure of a multi-phase generator shown in FIG. 1 and FIG. 2.

A one exemplary circuit of the phase regulator 7 and the multi-phase generator 8 is shown in FIG. 4. The multi-phase generator 8 comprises a delay locked loop (DLL) 14 to produce various sampling phases PH1 . . . PHj for the j connections of output connections 2 of the commutator 1. Multi-phase generator 8 also comprises a phase selector 15 and a phase interpolator 16. Different output phases of a phase locked loop (PLL) 17 are fed to the phase selector 15, which in turn receives a reference clock REFCLK. Such an approach enables the phase regulation process to be carried out very quickly via the DLL locked loop 14. In addition, the design of the PLL locked loop 17 itself can be heavily attenuated, in order to optimise its phase jitter.

The input clock signal of the DLL locked loop 14 is, for this purpose, obtained via the phase selector 15 or phase interpolator 16 from the PLL locked loop 17, which is permanently interlocked (that is, synchronized) with the reference clock REFCLK. The overall delay of the DLL locked loop 14 is controlled such that one rotation of the commutator 1 generally equates to the duration of a bit cell. For this purpose, it may be expedient to roughly adjust the DLL locked loop 14 via a bias current BIAS, which is obtained from the PLL locked loop 17. The individual phases of the commutator 1 are obtained either directly from the DLL locked loop 14 or recovered via interpolation of adjacent output signals of the DLL locked loop 14, depending on the number of phases of the commutator 1 and the minimum delay of a DLL basic cell in a given technology.

The phase regulator 7 initially acts on the phase interpolator 16 to track the phase in proportion to the control difference. After reaching the end of the setting range of the phase interpolator also on the phase selector 15, whereby the phase interpolator 16 during further switching of the phase selector 15 is brought by one stage to the particular other end of the setting range so that seemless changeover of the phase of the commutator 1 results.

A phase change in a such system must occur at a timepoint when the output of the phase selector 15 and of the phase interpolator 16 is in a rest state and sufficient time must remain till the next necessary excitation of the DLL locked loop 14, so that the newly selected phase selection or phase interpolation has sufficient preparation time.

In the case of the CDR circuitry according to the invention, the timepoint for introducing the phase change is provided directly after the DLL locked loop 14 has been excited. In this case, a whole bit period remains until the next excitation of the DLL locked loop 14.

It is especially advantageous if the integration controlled by the commutator 1 takes place from bit cell to bit cell, alternately on one of two integrators or capacitors in each case.

The phase information lying on the integrator or capacitor is, as a result, always available up to the center of the next bit cell, which not only allows phase readjustment after the start of this bit cell but provides additional time for complete readjustment of the integrator or discharge of the capacitor. The integrator or capacitor is changed on the other hand in the center of the bit cell, which is configured without any problem in the case of the CDR method according to the invention, since no integration takes place in the center of the bit cell. In lieu of which the commutator 1 feeds the input signal onto the circuit parts provided to form the regenerated data signal or uniting signal VS1 (see FIG. 3).

An advantageous variant of this type of CDR circuitry described above is shown in FIG. 5. As FIG. 5 shows the circuit 6 comprises two capacitors $13_1$ and $13_2$, which serve as integrators. The particular active integrator or capacitor is switched over via two switches 18 and 19 which are triggered by a FLIP signal of half the bit rate. The FLIP signal changes at a timepoint when integration is already complete, for example, in the center of the bit cell and therefore at a timepoint inside the bit cell, when the data is recovered by evaluating the uniting signal VS1.

Integration by discharging the capacitors $13_1$ and $13_2$ can be readjusted, for example, with a MOS transistor 20 acting as switch, the gate connection of which is triggered by a RESET signal. The RESET signal is activated when the phase regulator 7 has evaluated the particular capacitor $13_1$ or $13_2$ connected in each case via the switch 19 with its input.

The time progressions of the FLIP and RESET signals are, for example, also shown in FIG. 3. During the time intervals C shown in FIG. 3, integration takes place via the capacitor or integrator $13_1$. On the other hand, during the time intervals D shown in FIG. 3, integration takes place via the capacitor or integrator $13_2$. In the time intervals E, the capacitor $13_1$ is discharged by the RESET signal while in the time intervals G the capacitor $13_2$ is discharged. In the time intervals F, the capacitor $13_2$ is connected with the phase regulator 7 while in the time intervals H the capacitor $13_1$ is connected with the phase regulator 7.

Implementation of the integrators 13, or 132 as capacitors shown in FIG. 5 is particularly feasible if the intermediate signals provided by the load switching circuits 4 are currents. In this case, their summation is also particularly simple. If the intermediate signal provided by the load switching circuits 4 is a voltage, an additional transconductor 21 shown as a dotted line in FIG. 5 is sufficient to change the sum of the individual voltages into a current before the capacitors. Also, a transconductor 21 can be connected to each load switching circuit 4, the summation current would then be formed by wiring the outputs of the individual transconductors together. This variant is especially advantageous if the signals are to be weighted differently.

Figure 6A:
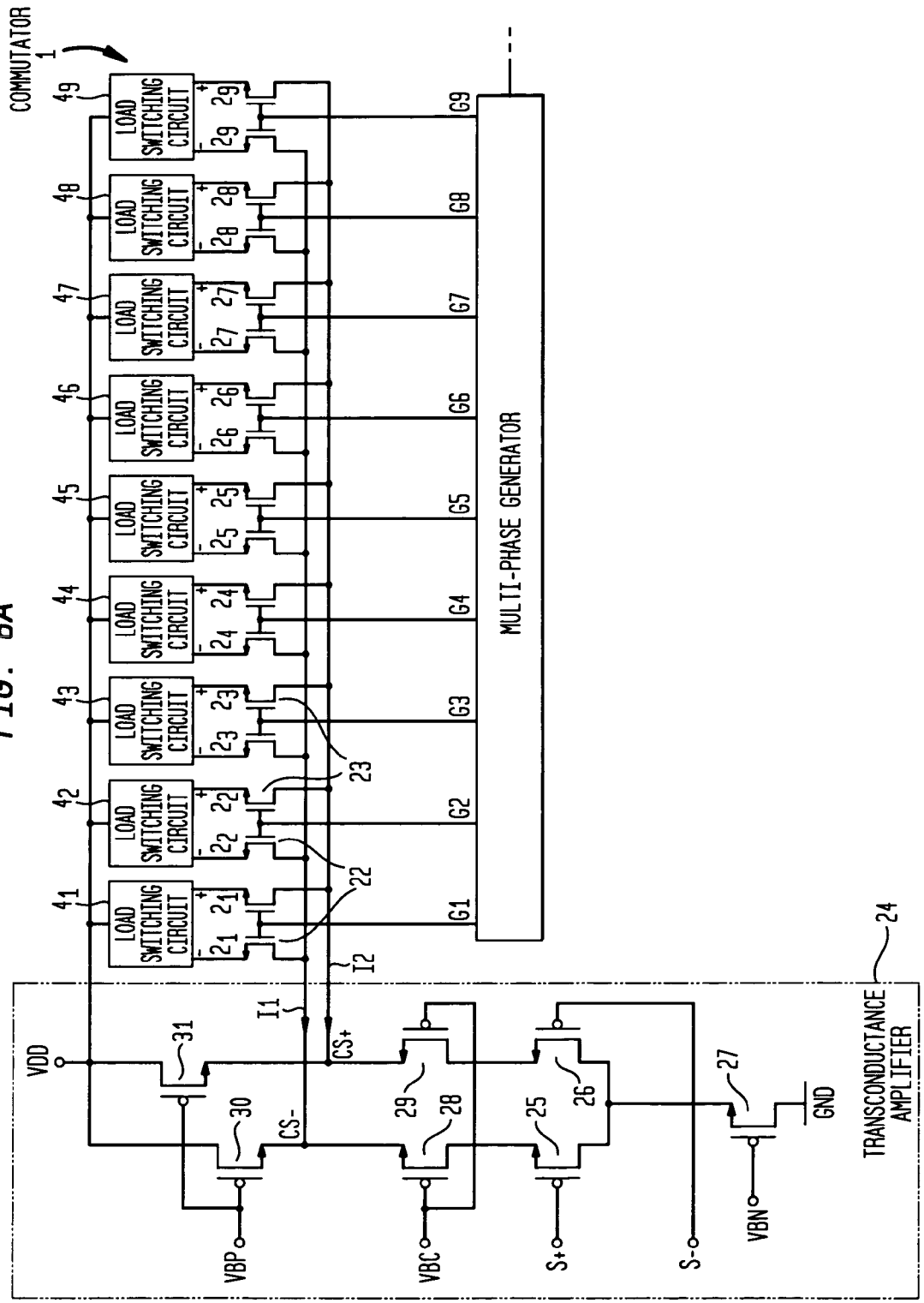

In FIGS. 6A, 6B and 7, a preferred implementation of an electronic commutator 1 and possible load switching circuits 4 is shown. The electronic commutator 1 can be implemented according to FIG. 6A by MOS transistors 22, 23, the source connections of which are connected in parallel to signal conducting nodes CS+ or CS−. In this case, CS+ is a node which carries the positive half of the differential signal, while CS− is that node which carries the negative half of the differential signal. The signal resulting from these nodes in each case is a current I1 or I2.

These currents are formed by a transconductance amplifier 24 depending on a differential input voltage corresponding to the received signal S, which is applied to input connections S+ and S−. This transconductance amplifier 24 in the case of the embodiment shown comprises of a differential pair with MOS transistors 25, 26 and a bottom stream source in the form of an MOS transistor 27, two cascode MOS transistors 28 and 29 as well as additional current source MOS transistors 30 and 31, which ensure that the whole bottom current from the MOS transistor 27 does not have to flow through the commutator 1 with the MOS transistors 22, 23 connected in parallel. Auxiliary DC voltages are applied via the input connections VBP, VEC and VBN to set the working points. A positive supply voltage connection to the transconductance amplifier 24 in comparison to the earth connection GND is identified by VDD.

The output terminals or output connections $2_{1-}$, $2_{1+}$ to $2_{9-}$, $2_{9+}$, of the commutator 1 lead to load switching circuits $4_1$ to $4_9$. The multi-phase generator 8 produces gate voltages G1–G9 for the MOS transistors of the commutator 1.

The progression of four of these gate-voltages G1–G4 is shown as an example in FIG. 6B, from which the overlapping progression of the gate voltages G1–G4 is evident. The number of phases of the commutator 1 or the number of its outputs is optional. If the electronic commutator 1 in a degenerative case had only the minimum number of two phases (in the case of a lower number the functionality of a commutator could no longer be guaranteed), in the completely differential case four MOS transistors, that is, two MOS transistors 22 and two MOS transistors 23, would need to be provided which are connected via the output connections $2_{1-}$, $2_{1+}$, $2_{2-}$ and $2_{2+}$ to two load switching circuits $4_1$ and $4_2$. The remaining MOS transistors shown in FIG. 6A of the electronic commutator 1 could then be eliminated.

In this degenerative case, and only in this case, the circuitry of the commutator 1 contains a part of the basic structure of a mixer based on a so-called Gilbert-Quad cell, as described in U.S. Pat. No. 5,329,189, hereby incorporated by reference herein. In contrast to a mixer of this kind, however, the output signal is not concentrated on common load elements, so that in actual fact no mixer of such kind is implemented.

Based on this degenerative case it can be best explained how the MOS transistors 22, 23 of the electronic commmutator 1 preferably work. They are triggered in an especially advantageous way according to FIG. 6B not through wide digital signal deviations so that they would work as switches, but through analog, overlapping and floating signals with restricted amplitude, ideal-wise phase-shifted sinusoidal signals of equal portion, so that a mixer operation results in the degenerative case described if the outputs $2_{1-}$, $2_{1+}$, $2_{2-}$ and $2_{2+}$, as in the case of a Gilbert-Quad multiplier, were to lead to an individual load switching circuit.

In such a Gilbert-Quad multiplier, the two transistors 22 connected to the nodes CS− would work as a first differential pair and the two transistors 23 connected to the nodes CS+ would work as a second differential pair. The clock and data recovery circuitry according to the invention, however, does not concern a mixer of this kind. Nevertheless, the basic working method of the transistors 22, 23 inside the electronic commutator 1 and the preferred method of their triggering through the multi-phase generator 8 should be clear as result of the above description.

In the case of practical embodiments of the CDR circuit arrangement according to the invention, the electronic commutator 1 normally has three or more phases. Accordingly, the "differential pairs", the common source connections of which are connected to CS− or CS+, have three or more transistors 22 or 23. As a result of the overlapping gate-signals of the multi-phase generator 8, shown as an example and extract-wise in FIG. 6B, especially advantageous working of the rotating commutation with an overlapping connecting method arises. The transistor with the highest gate source voltage can transmit the greatest part of the current I1 or I2 to its load switching circuit while the transistor with the next lowest gate source voltage can transmit a correspondingly smaller part etc. Some transistors possibly conduct no or only very little current (weak inversion). The weighted distribution of the signal described in the case of the mechanical embodiment by a resistance mass in the wiper contact of the rotor of the commutator results from the natural behavior of the MOS transistor, especially from its channel resistance so that, due to triggering of the MOS transistors 22 or 23 by the phase shifted gate voltages of the multi-phase generator 8, the weighted distribution of the (differential) received signal is effected onto the individual output connections of the electronic commutator 1 or on the load switching circuits connected with this.

As a result of the overlapping triggering shown as an example in FIG. 6B of several transistors assigned to several output connections of the commutator 1, a weighted distribution of the corresponding sampling values onto the particular output connections of the commutator 1 is achieved. For example, in the mechanical embodiment of commutator 1 shown in FIG. 1, the simultaneous contact of the wiper contact 3 with several output connections 2, whereby in the case of this embodiment, the weighted distribution of the sampling values onto the individual output connections 2 in contact with the wiper contact 3 acts differently on the individual output connections 2 as a result of the resistance value of the wiper contact 3). Due to this weighted distribution caused by the overlapping connecting method of the transistors described above, a so called "kick back" effect, which would result in interruption of the current flow, can be avoided and floating continuous signal emission of the commutator 1 is achieved.

Advantageously, at least three output connections of the commutator 1 are always triggered overlapping (in the Figs. for example the output connections $2_6$–$2_8$), as a result of which with regard to the data transmission rate especially interesting in this particular case in the Gigabit region, modulation effects can be effectively avoided.

FIGS. 7A–7E are schematic diagrams of illustrative embodiments of the load switching circuits 4. Essentially, there are four cases relevant in practice: inside the load switching circuits 4 the current can either be mirrored (FIG. 7A) or reversed (FIG. 7B) or again converted into a voltage (FIG. 7C) or also squared (FIG. 7D). Also, other circuits beyond the four cases mentioned to fulfil any required functions can be implemented.

In FIG. 7A–FIG. 7D, the reference 2 identifies the connection leading to an output connection the commutator 1. VDD designates a positive supply voltage and $I_k$ designates the terminal current flowing via the particular commutator connection.

In FIG. 7A, a current mirror as load switching circuit 4 is shown with p-channel MOS transistors 32 and 33 which have a voltage ratio of 1:A so that, accordingly, the current emitted by the load switching circuit 4 is increased in comparison to the current $I_k$ by the factor A.

In the case of the variant shown in FIG. 7B of the load switching circuit 4, a current $I_o$ is fed to a serial circuit from p-channel MOS transistors 34, 35 and the current $I_k$ is tapped off between the transistors so that the current $I_o$–$I_k$ is emitted by the load switching circuit. The MOS transistor 34 serves as current source while the MOS transistor 35 serves as cascade transistor. In FIG. 7B, VBP and VBCP designate DC voltages to set the working point of the transistors 34, 35.

According to FIG. 7C, the current $I_k$ is simply fed via an electronic resistor 36 with the resistance value R so that a voltage UR results at the resistor 36. The resistor 36 can, for example, be replaced by a MOS transistor working in the triode range. Preferably the component used in each case has a sufficiently linear current/voltage characteristic.

In the case of the variant shown in FIG. 7D, a power evaluation takes place and, supplementary to FIG. 7C, a p-channel MOS transistor 37 with a threshold voltage $V_{TH}$ is provided so that the current I flowing through this transistor is proportional to $(U_R-V_{TH})^2$.

For totally differential circuit technology, the circuits shown in FIGS. 7A–7D are found twice in a load switching circuit (once in each case for the "+" and "−" terminals of the electronic commutator 1 as also indicated in FIG. 6A).

FIG. 7E shows a combination of the resistance load 36 of FIG. 7C with a regenerative amplifier 38 with n-channel MOS transistors 40 wired according to FIG. 7E which are pulsed by switching on a bottom current source 39. After signal regeneration by the regenerative amplifier 38, the signal regenerated to full excursion can be transmitted via p-channel MOS transistors 41 acting as switches to the following stages by their gate signal G being activated. This circuit must always be connected due to their differential working method with a differential output terminal pair 2+, 2− of the commutator 1.

In the circuits shown in FIGS. 7A–7E, the currents coming from the commutator 1 can also be additionally weighted individually; that is, differently weighted from load switching circuit to load switching circuit based on the dimensions of their components being varied accordingly. Especially capable of achieving equal impedances of the load switching circuits (as seen from the commutator 1) in this case is the arrangement shown in FIG. 7B since it is generally independent of the load circuits following after the cascade but essentially is only defined by the rate of rise of the cascode transistors 35. Naturally, the circuits described above can also be modified in such a way that transistors with opposite wiring can be used in each case.

Figure 8:
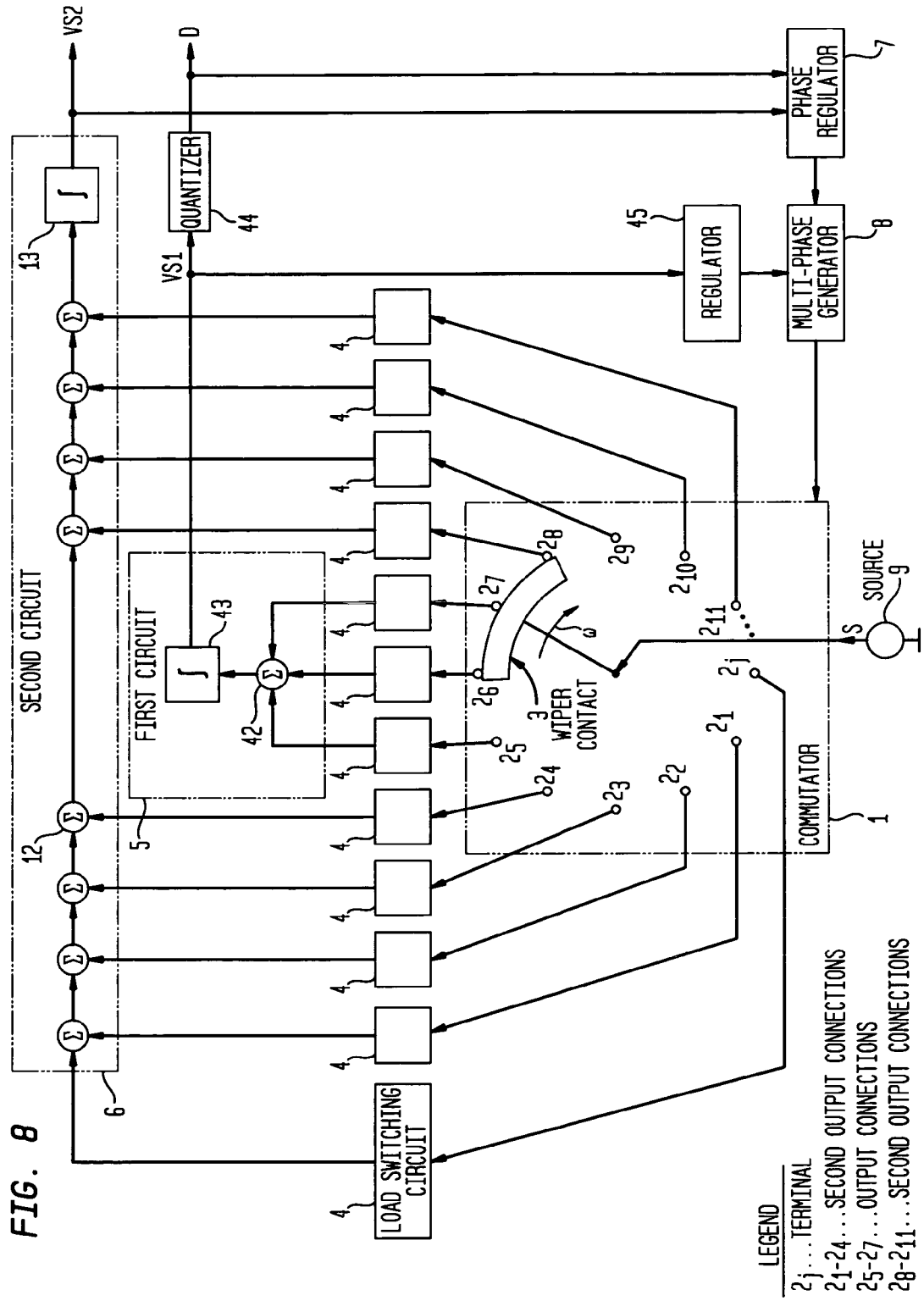
FIG. 8 shows the structure of a CDR circuit arrangement according to a third embodiment of the invention.

A further embodiment of a CDR circuit arrangement according to the present invention is shown in FIG. 8. As illustrated in FIG. 8, the uniting signal VS1 used for data regeneration is formed by integration, whereby the intermediate signals flowing into the uniting signal VS1 of the output connections $2_5$–$2_7$ of the electronic commutator 1 or of the corresponding load switching circuits 4, are firstly summed up with the aid of at least one adder 42 and then fed to an integrator 43. A quantizer 44 is connected to integrator 43 to form a digital integration signal in order to form the regenerated digital data signal D from VS1. In the case of this embodiment, a measurement for the signal quality of the time interval used for data regeneration occurs on VS1 as absolute value of the integration result.

As a result of an additional regulator 45 which controls the extension of this time interval in such a way that only a very slightly fluctuating but nevertheless maximum large integration result occurs on VS1, the distribution of the received signal S onto the two portions or uniting signals can be optimized on the one hand for data recovery (VS1) and on the other hand for phase detection (VS2) in such a way that the first mentioned portion optimally covers the data "eye" (as shown in FIG. 3). This distribution of the received signal S can be controlled through the regulator 45 acting on the delay of the DLL stages of the DLL locked loop 14 (FIG. 4), which are responsible for the output connections of the commutator 1 acting on the uniting signal VS1, so that the phase of output connections $2_5$–$2_7$ (FIG. 8) of the electronic commutator 1 is influenced accordingly.

If the delay of these inner DLL stages is sufficiently slowly increased by the regulator 45, the regulation inside the DLL locked loop 14 would reduce the delay of the remaining outer DLL stages, so that the total delay of the DLL locked loop 14 continues to correspond to the ideal value for the DLL setting. In this case, however, division of the total signal is shifted to the uniting signals VS1 and VS2. As rule of thumb for the regulator 45, gradual increase in the delay of the inner DLL stages is sufficient so long as the integration result increases in the center and only fluctuates a little from integration to integration. Should these fluctuations become too great this is an indication that the integration no longer only takes place inside the stable data "eye" but has already reached the zone with signal changes (that is, any of the time intervals B shown in FIG. 3). Whereupon the regulator 45 should slowly reduce the delay of the inner DLL stages until the fluctuations decrease and then the delay is gradually increased again etc. Other appropriate rules of thumb are also possible.

Many communication channels require the observation of a very long section of the data stream which for example can comprise approx. 1000 bits to determine the true size of the data signal. Due to this characteristic of communication channels, the regulator 45 preferably operates very slowly and sluggishly in the direction of greater time lag, and react considerably quicker in the direction of shorter time lag. In addition, strict limitation of the setting range of the delay of the DLL stages inside safer limits is recommended, so that it is ensured that both for data regeneration (integration of VS1) as well as for phase detection (integration of VS2) the integration time is sufficiently long. Therefore, in one preferred embodiment the regulator 45 a digital control algorithm. Since for such kind of digital regulator 45 the uniting signal VS1 cannot be further processed as an analog signaly, the quantizer 44 is not implemented as a threshold value "slicer" switch, but as an analog/digital converter, so that the corresponding digital signal at the output of the quantizer 44 is fed to the regulator 45 instead of the analog uniting signal VS1.

A further illustrative embodiment of the invention is shown in FIG. 9. According to FIG. 9, more than two uniting signals, for example three uniting signal VS1, VS2 and VS3, are produced. In this case, the uniting signal VS1 continues to be used for data regeneration and the uniting signal VS2 for phase detection and therefore clock recovery. The sampling interval of the uniting signal VS3 lies between the sampling intervals of the uniting signals VS1 and VS2. The uniting signal VS3, for example, can be generated by addition of the intermediate signals acquired at the output connections 24 and 28 with an adder 46, and subsequent integration with an integrator 43. In such an embodiment, uniting signal VS3 represents the area on the edge of the particular bit cell. The uniting signal VS3 can be used in conjunction with the embodiment shown in FIG. 8 for regulating the time interval of the uniting signal VS1. In such an application, uniting signal VS3 is provided to the (time interval) regulator 45. In this case, fluctuation in the uniting signal can be noticed before the uniting signal VS1 is impaired.

This embodiment, in particular, can also be used in an arrangement according to FIG. 2, in which the uniting signal VS1 does not originate from integration but from a digital majority decision.

The uniting signal VS3 can also be recovered similarly to uniting signals VS1 and VS2 instead of the addition shown in FIG. 9 and integration in the analog area by combining regenerative amplifier stages with a digital majority decision element as explained illustratively for the uniting signal VS1 on the basis of FIG. 2.

Naturally, the number j of the output connections or output terminals of the electronic commutator 1 is not limited to the number shown in the drawing, but can deviate from this. In particular, if the length of the DLL locked loop 14 shown in FIG. 4 is multiplied as well as the number j of the output connections of the electronic commutator 1 (with corresponding multiplication of the uniting signals), the circuit frequency of the cyclic commutation as regards the output connections 2 can be reduced. This may be necessary if too high a data rate in comparison to the speed of the semiconductor process would lead to bottlenecks in the time sequence. For such extreme cases, the commutator 1 can be usefully expanded so that one of its rotations or cycles comprises more than one bit cell, that is to say at least part of a further bit cell, is sampled by the electronic commutator 1 during one rotation.

The invention claimed is:

1. A circuit arrangement to recover clock and data from a received signal, comprising:
    a commutator device for sampling the received signal and for distributing several sampling values of a bit cell, transmitted with the received signal, time-wise consecutively onto several output connections of the commutator device, where the sampling values are emitted in the form of corresponding intermediate signals;
    a first circuit for combining a first group of intermediate signals of the commutator device into a first uniting signal, which serves as the basis for data recovery;
    a second circuit for combining a second group of intermediate signals of the commutator device into a second uniting signal, which serves as the basis for clock recovery; and
    a phase regulator arrangement, to which is fed the second uniting signal and which sets sampling phases for sampling the received signal assigned to the individual output connections of the commutator device based on said second uniting signal.

2. The circuit arrangement according to claim 1, wherein the first group of intermediate signals and the second group of intermediate signals are portions not overlapping one another of the intermediate signals emitted via all the output connections of the commutator device.

3. The circuit arrangement according to claim 1, wherein the first group of intermediate signals is selected such that sampling values of a particular bit cell assigned to a corresponding output connection of the commutator device lie in a central time interval of the bit cell, and wherein the second group of intermediate signals is selected such that sampling values of a particular bit cell assigned to a corresponding output connection of the commutator device lie in a side time interval of the bit cell adjacent to the central time interval.

4. The circuit arrangement according to claim 1, comprising:
    a plurality of load switching circuits via which the first group of intermediate signals is fed to the first circuit and the second group of intermediate signals to the second circuit.

5. The circuit arrangement according to claim 4, wherein the load switching circuits comprise:
    a power mirror circuit connected to a particular output connection of the commutator device and to the first or second circuit.

6. The circuit arrangement according to claim 4, wherein the load switching circuits comprise:
    a serial circuit comprising a first and a second transistor, wherein a nodal point between the two transistors is connected to the particular output connection of the commutator device and the second transistor to the first or second circuit (5, 6).

7. The circuit arrangement according to claim 4, wherein the load switching circuits are configured to convert a current flowing via a particular output connection of the commutator device into a corresponding voltage, and to feed this corresponding voltage to the first or second circuit.

8. The circuit arrangement according to claim 4, wherein the load switching circuits are configured to feed a signal to the first or second circuit, which is proportional to a squared current flowing via the particular output connection of the commutator device.

9. The circuit arrangement according to claim 4, wherein the load switching circuits comprise amplifier stages.

10. The circuit arrangement according to claim 4, wherein the received signal is comprised of two differential part signals, and wherein the load switching circuits and the commutator device each have a differential structure with separate circuit segments for processing the two differential part signals.

11. The circuit arrangement according to claim 4, wherein the load switching circuits have an identical load impedance acting on a corresponding output connection of the commutator device.

12. The circuit arrangement according to claim 4, wherein the load switching circuits have an identical structure, wherein the components of the load switching circuits have different dimensions, in order to weight differently the corresponding intermediate signals of the commutator device in the first or second uniting signal.

13. The circuit arrangement according to claim 1, wherein the commutator device is implemented in the form of an electronic transistor circuit, wherein the phase regulator arrangement sets the sampling phases by producing corresponding control signals, which in each case control the conductivity of the transistors assigned to the individual output connections of the commutator device.

14. The circuit arrangement according to claim 13, wherein the commutator device is implemented in the form of an electronic MOS transistor circuit, wherein the control signals of the phase regulator arrangement are applied to gate connections of the transistors assigned to the individual output connections of the commutator device.

15. The circuit arrangement according to claim 13, wherein the received signal is composed of two differential part signals, and the commutator device has a differential structure; and further wherein a transistor pair is assigned to each output connection of the commutator device, wherein one transistor of the transistor pair receives the one part signal and the other transistor of the transistor pair the other part signal.

16. The circuit arrangement according to claim 15, wherein the control signal of the phase regulator arrangement assigned to the particular output connection of the commutator device is fed in each case jointly to control connections of the two transistors of each transistor pair.

17. The circuit arrangement according to claim 15, wherein the differential part signals of the received signal are fed via a transconductance amplifier circuit to the two transistors of each transistor pair.

18. The circuit arrangement according to claim 15, wherein the one transistors of the transistor pairs receive in each case via a first connection of these transistors the one part signal and the other transistors of the transistor pairs in each case via a first connection of these transistors the other part signal, and wherein in each case the one transistor of the transistor pairs is connected via a second connection of this transistor to a first differential part connection of the commutator device and in each case the other transistor of the transistor pairs is connected via a second connection of this transistor with a second differential part connection of the commutator device, whereby the first and second differential part connection in each case is assigned to a corresponding output connection of the commutator device.

19. The circuit arrangement according to claim 13, wherein the phase regulator arrangement in dependence on the second uniting signal in each case sets the phase position of the control signals assigned to the individual output connections of the commutator device.

20. The circuit arrangement according to claim 1, wherein the phase regulator arrangement comprises:
a phase regulator, to which the second uniting signal is fed; and
a multi-phase generator triggered by the phase regulator, which sets the sampling phases assigned to the individual output connections of the commutator device.

21. The circuit arrangement according to claim 20, wherein the multi-phase generator comprises a DLL locked loop for producing the sampling phases.

22. The circuit arrangement according to claim 21, wherein the multi-phase generator comprises:
a PLL locked loop, driven by a reference clock;
a phase selector coupled with the PLL locked loop and triggered by the phase regulator; and
a phase interpolator triggered by the phase regulator and coupled with the DLL locked loop.

23. The circuit arrangement according to claim 21, wherein the phase regulator and the multi-phase generator are configured such that a phase change in a sampling phase of the commutator device always takes place directly after the DLL locked loop of the multi-phase generator has been excited.

24. The circuit arrangement according to claim 20, wherein the multi-phase generator comprises a PLL locked loop for producing the individual sampling phases.

25. The circuit arrangement according to claim 1, wherein a signal derived from the first uniting signal for recognizing state changes of the received signal is fed to the phase regulator arrangement.

26. The circuit arrangement according to claim 25, wherein the phase regulator arrangement is configured such that, in dependence on evaluation of the signal derived from the first uniting signal, it multiplies the second uniting signal before further evaluation of the same with a weighting factor.

27. The circuit arrangement according to claim 26, wherein the phase regulator arrangement is configured such that, in dependence on evaluation of the signal derived from the first uniting signal, multiplies the second uniting signal optionally with −1, 0 or +1.

28. The circuit arrangement according to claim 1, wherein the first circuit comprises:
at least one adder to add the first group of intermediate signals of the commutator device; and
at least one integrator connected afterwards, wherein the integrator provides the first uniting signal.

29. The circuit arrangement according to claim 28, wherein the integrator is connected to a quantizer that produces a recovered data signal from the first uniting signal.

30. The circuit arrangement according to claim 28, wherein the intermediate signals combined into the first uniting signal are voltage signals, and that the first circuit has a voltage/current converter before the integrator.

31. The circuit arrangement according to claim 1, wherein the first circuit comprises:
a plurality of amplifier stages for converting the first group of intermediate signals into corresponding digital signals; and
a digital majority decision element connected to the plurality of amplifier stages, which by evaluating the digital signals of the amplifier stages provides the uniting signal, wherein the first uniting signal at the same time serves as a recovered data signal.

32. The circuit arrangement according to claim 1, wherein the second circuit comprises:
a plurality of amplifier stages for converting the second group of intermediate signals into corresponding digital signals; and
a digital majority decision element connected to the plurality of amplifier stages, which by evaluating the digital signals of the amplifier stages, provides the second uniting signal.

33. The circuit arrangement according to claim 1, wherein the second circuit comprises:
   at least one adder for adding the second group of intermediate signals of the commutator device; and at least one integrator connected to the at least on adder, wherein the integrator provides the second uniting signal.

34. The circuit arrangement according to claim 33, wherein the intermediate signals combined into the second uniting signal are voltage signals, and wherein the second circuit has a voltage/current converter before the integrator.

35. The circuit arrangement according to claim 33, wherein the second circuit comprises:
   at least two integrators connected after the at least one adder; and
   one or more controllable switches for alternate switching between the integrators from bit cell to bit cell.

36. The circuit arrangement according to claim 35, wherein the controllable switches switch over between the integrators inside each bit cell during a time interval, in which the commutator device assigns the sampling values of the received to the first group of intermediate signals to form the first uniting signal.

37. The circuit arrangement according to claim 35, wherein the controllable switches are triggered with a control signal, which has half the bitrate of the received signal.

38. The circuit arrangement according to claim 35, wherein the controllable switches comprise a first switch between the at least one adder and the integrators as well as a second switch between the integrators and the phase regulator arrangement.

39. The circuit arrangement according to claim 35, wherein the second circuit further comprises:
   a further controllable switch is coupled to the integrators and implemented in the form of capacitor circuits to discharge the corresponding capacitors.

40. The circuit arrangement according to claim 29, wherein the further controllable switch is connected between the second switch and the phase regulator arrangement.

41. The circuit arrangement according to claim 1, further comprising:
   a time interval regulator is provided for regulating the time extension of a time interval used for data recovery by evaluating the first uniting signal.

42. The circuit arrangement according to claim 41, wherein the time interval regulator evaluates the first uniting signal and triggers the phase regulator arrangement for regulating the sampling phases of the output connections of the commutator device used for the first uniting signal.

43. The circuit arrangement according to claim 41, wherein the time interval regulator is configured in a digital way and evaluates the first uniting signal digitalized with the aid of a quantizer.

44. The circuit arrangement according to claim 41, comprising:
   a third circuit for combining a third group of intermediate signals of the commutator device into a third uniting signal whereiny time intervals in which the sampling values of the received signal are distributed by the commutator device onto the output connections corresponding to the third group of intermediate signals, lie between a time interval, in which the sampling values of the received signal are distributed by the commutator device onto the output connections corresponding to the first group of intermediate signals, and time intervals, in which the sampling values of the received signal are distributed by the commutator device onto the output connections corresponding to the second group of intermediate signals, and that the time interval regulator evaluates the third uniting signal and triggers the phase regulator arrangement for regulating the sampling phases of the output connections of the commutator device used for the first uniting signal.

45. The circuit arrangement according to claim 44, wherein the third circuit comprises:
   at least one adder for adding the third group of intermediate signals of the commutator device; and
   at least one integrator connected afterwards, wherein the integrator provides the third uniting signal.

46. The circuit arrangement according to claim 45, wherein the time interval regulator is configured in a digital way and evaluates the third uniting signal digitalized with the aid of a quantizer.

47. The circuit arrangement according to claim 45, wherein the third circuit comprises:
   a plurality of amplifier stages for converting the third group of intermediate signals into corresponding digital signals; and
   a digital majority decision element connected to the plurality of amplifier stages, which, by evaluating the digital signals of the amplifier stages, provides the third uniting signal.

48. The circuit arrangement according to claim 1, wherein at least one intermediate signal emitted via a corresponding output connection of the commutator device is neither assigned to the first group of intermediate signals nor to the second group of intermediate signals.

49. The circuit arrangement according to claim 1, wherein the received signal is comprised of two differential part signals and that the circuit arrangement for separate processing of the differential part signals at least partly has a differential structure.

50. The circuit arrangement according to claim 1, wherein the commutator device is configured such that it distributes the sampling values of the bit cells of the received signal cyclically onto the individual output connections of the commutator device.

51. The circuit arrangement according to claim 50, wherein the commutator device is configured such that it distributes a sampling value of this bit cell onto each output connection for each bit cell of the received signal.

52. The circuit arrangement according to claim 50, wherein the commutator device is configured such that it distributes sampling values of more than one as a bit cell of the received signal onto the output connections for each cycle.

53. The circuit arrangement according to claim 1, wherein the commutator device is configured such that it distributes sampling values of the received signal simultaneously onto several output connections of the commutator device.

54. The circuit arrangement according to claim 53, wherein the commutator device is configured such that it distributes sampling values of the received signal simultaneously onto at least three output connections of the commutator device.

* * * * *